United States Patent
Bishop et al.

(10) Patent No.: US 11,411,191 B2
(45) Date of Patent: Aug. 9, 2022

(54) SELENIUM-FULLERENE HETEROJUNCTION SOLAR CELL

(71) Applicant: International Business Machines Corporation, Armonk, NY (US)

(72) Inventors: Douglas M. Bishop, New York, NY (US); Yun Seog Lee, White Plains, NY (US); Saurabh Singh, Yonkers, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/846,971

(22) Filed: Apr. 13, 2020

(65) Prior Publication Data

US 2020/0243784 A1 Jul. 30, 2020

Related U.S. Application Data

(62) Division of application No. 15/431,900, filed on Feb. 14, 2017, now Pat. No. 10,651,408.

(51) Int. Cl.
*H01L 51/42* (2006.01)
*H01L 31/0272* (2006.01)
(Continued)

(52) U.S. Cl.
CPC ...... *H01L 51/4213* (2013.01); *H01L 31/0272* (2013.01); *H01L 31/0468* (2014.12); *H01L 51/0047* (2013.01); *Y02P 70/50* (2015.11)

(58) Field of Classification Search
CPC ............ H01G 9/20–28; H01L 31/0272; H01L 31/0275; H01L 31/0468; H01L 31/02725; H01L 31/022491
See application file for complete search history.

(56) References Cited

U.S. PATENT DOCUMENTS 3,622,712 A * 11/1971 Moore ............. H01L 21/02521
369/137
4,064,522 A * 12/1977 Shaw .................. H01L 31/0272
136/260
4,259,122 A * 3/1981 Purwin ........... H01L 31/022466
136/258
(Continued)

FOREIGN PATENT DOCUMENTS

JP S61226974 A 10/1986
WO WO-2011108116 A1 * 9/2011 ............. H01L 31/06
(Continued)

OTHER PUBLICATIONS

Machine translation of JP2011/108116A1 (Year: 2011).*
(Continued)

*Primary Examiner* — Eric R Smith
(74) *Attorney, Agent, or Firm* — Jeffrey S. LaBaw; Michael J. Chang, LLC

(57) ABSTRACT

Selenium-fullerene heterojunction solar cells and techniques for fabrication thereof are provided. In one aspect, a method of forming a solar cell includes: forming a front contact on a substrate; depositing an n-type semiconducting layer on the front contact, wherein the n-type semiconducting layer comprises a fullerene or fullerene derivative; forming a p-type chalcogen absorber layer on the n-type semiconducting layer; depositing a high workfunction material onto the p-type chalcogen absorber layer, wherein the high workfunction material has a workfunction of greater than about 5.2 electron volts; and forming a back contact on the high workfunction material. Solar cells and other methods for formation thereof are also provided.

9 Claims, 7 Drawing Sheets

(51) Int. Cl.
*H01L 51/00* (2006.01)
*H01L 31/0468* (2014.01)

(56) References Cited

U.S. PATENT DOCUMENTS

| | | | |
|---|---|---|---|
| 4,816,715 | A | 3/1989 | Unnai et al. |
| 5,196,702 | A | 3/1993 | Tsuji et al. |
| 6,110,563 | A | 8/2000 | Pienimaa et al. |
| 8,741,448 | B2 | 6/2014 | Chen et al. |
| 9,425,420 | B2 | 8/2016 | Yang et al. |
| 9,502,658 | B2 | 11/2016 | Jackson et al. |
| 2009/0246402 | A1 | 10/2009 | Mataki et al. |
| 2009/0266399 | A1 | 10/2009 | Basol et al. |
| 2010/0307589 | A1 | 12/2010 | Choi et al. |
| 2011/0088747 | A1 | 4/2011 | Alstrup et al. |
| 2012/0061247 | A1 | 3/2012 | Ahmed et al. |
| 2015/0014627 | A1* | 1/2015 | Yu ............ H01L 31/046 257/13 |
| 2015/0122324 | A1 | 5/2015 | Eisaman et al. |
| 2015/0136232 | A1 | 5/2015 | Snaith et al. |
| 2016/0035927 | A1 | 2/2016 | Gershon et al. |
| 2016/0204304 | A1 | 7/2016 | Gunawan et al. |

FOREIGN PATENT DOCUMENTS

| | | | |
|---|---|---|---|
| WO | WO2015127494 | A1 | 9/2015 |
| WO | WO-2018104943 | A1 * | 6/2018 ..... H01L 31/022441 |

OTHER PUBLICATIONS

Yan et al., "Preparation of Fullerene Polycrystalline Films on Different Substrates by Physical Vapor Deposition," Materials Transactions, vol. 48, No. 4, pp. 700-703 (Mar. 2007).

Pachauri et al., "Chemically exfoliated large-area two-dimensional flakes of molybdenum disulfide for device applications," APL Materials 1, 032102 (Sep. 2013) (10 pages).

N.J. Jeon et al., "Compositional engineering of perovskite materials for high-performance solar cells," Nature, vol. 517, No. 7535, Jan. 2015, pp. 476-480.

K. Wojciechowski et al., "Heterojunction modification for highly efficient organic-inorganic perovskite solar cells," ACS Nano, vol. 8, No. 12, Nov. 2014, p. 12701-12709.

M. Zhu et al., "Solution-Processed Air-Stable Mesoscopic Selenium Solar Cells," ACS Energy Letters, vol. 1, No. 2, Jul. 2016, pp. 469-473.

M. Zhu et al., "Supporting Information: Solution-Processed Air-Stable Mesoscopic Selenium Solar Cells," ACS Energy Letters, 1 (Year: 2016).

K. Wang, et al., "Selenium as a photoabsorber for inorganic-organic hybrid solar cells," Physical Chemistry Chemical Physics 16, p. 23316-23319 (Year: 2014).

Tao et al., "17.6% stabilized efficiency in low-temperature processed planar perovskite solar cells," Energy Environ. Sci., 8, pp. 2365-2370 (Jun. 2015).

Wang et al., "Large fill-factor bilayer iodine perovskite solar cells fabricated by a low-temperature solution-process," Energy Environ. Sci., 7, pp. 2359-2365 (Apr. 2014).

Nagaoka, et al., "Zr Incorporation into TiO2 Electrodes Reduces Hysteresis and Improves Performance in Hybrid Perovskite Solar Cells while Increasing Carrier Lifetimes," J. Phys. Chem. Lett., 6 (4), Abstract (Jan. 2015).

T. Nakada and A. Kunioka, "Polycrystalline thin-film TiO2/Se solar cells", Japanese Journal of Applied Physics 24(7), p. L536-L538 (1985).

Machine translation of JP61-226947A.

List of IBM Patents or Applications Treated as Related (2 pages).

* cited by examiner

Primary direction of light

Primary direction of light

|  | Eff | FF | Voc | Jsc | R-Jsc | R-Voc |
|---|---|---|---|---|---|---|
|  | % | % | mV | mA/cm^2 | Ω.cm^2 | Ω.cm^2 |
| Regular (down) | 6.6 | 59.0 | 965.2 | 11.6 | 568 | 11 |
| Regular (up) | 5.7 | 52.1 | 944.0 | 11.6 | 527 | 17 |
| ICBA (down) | 6.5 | 53.5 | 943.8 | 12.9 | 585 | 17 |
| ICBA (up) | 6.6 | 53.8 | 948.3 | 13.0 | 653 | 15 |

FIG. 20

SELENIUM-FULLERENE
HETEROJUNCTION SOLAR CELL

CROSS-REFERENCE TO RELATED
APPLICATION(S)

This application is a divisional of U.S. application Ser. No. 15/431,900 filed on Feb. 14, 2017, now U.S. Pat. No. 10,651,408, the disclosure of which is incorporated by reference herein.

FIELD OF THE INVENTION

The present invention relates to photovoltaic-based devices, and more particularly, to selenium-fullerene heterojunction solar cells.

BACKGROUND OF THE INVENTION

Selenium (Se)-based solar cells have a higher band gap than most commercial solar cells including silicon (Si), copper-indium-gallium selenide (CIGS) and cadmium telluride (CdTe). As such, Se-based solar cells are capable of delivering higher voltage and enhanced efficiency with artificial (light-emitting diode (LED) or fluorescent) light making them suitable power sources for miniaturized electronic devices, such as wearable, internet of things (IoT) and other devices, especially indoors.

However, oxide heterojunction partners in Se-based solar cells often exhibit hysteretic behavior. This hysteresis is most likely due to transport limitations at the heterojunction interface.

Therefore, Se heterojunction solar cell designs with improved performance would be desirable.

SUMMARY OF THE INVENTION

The present invention provides selenium-fullerene heterojunction solar cells and techniques for fabrication thereof. In one aspect of the invention, a method of forming a solar cell is provided. The method includes the steps of: forming a front contact on a substrate; depositing an n-type semiconducting layer on the front contact, wherein the n-type semiconducting layer includes a fullerene or fullerene derivative; forming a p-type chalcogen absorber layer on the n-type semiconducting layer; depositing a high workfunction material onto the p-type chalcogen absorber layer, wherein the high workfunction material has a workfunction of greater than about 5.2 electron volts; and forming a back contact on the high workfunction material.

In another aspect of the invention, another method of forming a solar cell is provided. The method includes the steps of: forming a back contact on a substrate; forming a p-type chalcogen absorber layer on the back contact; depositing an n-type semiconducting layer on the p-type chalcogen absorber layer, wherein the n-type semiconducting layer includes a fullerene or fullerene derivative; forming a front contact on the n-type semiconducting layer; and forming a metal grid on the front contact.

In yet another aspect of the invention, a solar cell is provided. The solar cell includes: a substrate; a front contact disposed on the substrate; an n-type semiconducting layer disposed on the front contact, wherein the n-type semiconducting layer includes a fullerene or fullerene derivative selected from the group consisting of: C60, phenyl-C61-butyric acid methyl ester, indene-$C_{60}$ bisadduct, C70, [6,6]-Phenyl C71 butyric acid methyl ester, and combinations thereof; a p-type chalcogen absorber layer disposed on the n-type semiconducting layer, wherein the p-type chalcogen absorber layer includes selenium such that a selenium-fullerene heterojunction is formed between the p-type chalcogen absorber layer and the n-type semiconducting layer; a high workfunction material disposed on the p-type chalcogen absorber layer, wherein the high workfunction material has a workfunction of greater than about 5.2 electron volts; and a back contact disposed on the high workfunction material.

In still yet another aspect of the invention, another solar cell is provided. The solar cell includes: a substrate; a back contact disposed on the substrate; a p-type chalcogen absorber layer disposed on the back contact, wherein the p-type chalcogen absorber layer includes selenium; an n-type semiconducting layer disposed on the p-type chalcogen absorber layer, wherein the n-type semiconducting layer includes a fullerene or fullerene derivative selected from the group consisting of: C60, phenyl-C61-butyric acid methyl ester, indene-$C_{60}$ bisadduct, C70, [6,6]-Phenyl C71 butyric acid methyl ester, and combinations thereof such that a selenium-fullerene heterojunction is formed between the p-type chalcogen absorber layer and the n-type semiconducting layer; a front contact disposed on the n-type semiconducting layer; and a metal grid disposed on the front contact.

A more complete understanding of the present invention, as well as further features and advantages of the present invention, will be obtained by reference to the following detailed description and drawings.

BRIEF DESCRIPTION OF THE DRAWINGS

FIG. 20 is a diagram illustrating the characteristics of the ICBA/ZMO solar cell of FIG. 19 according to an embodiment of the present invention.

DETAILED DESCRIPTION OF PREFERRED EMBODIMENTS

As provided above, selenium (Se)-based solar cells have a high band gap, making them well suited for integration into miniaturized electronic devices, such as wearable, internet of things (IoT) and other devices. However, Se-based solar cells often exhibit hysteretic behavior due to transport limitations at the heterojunction interface. In general, hysteresis is a time-dependent lag in output for a given input. With regard to solar cells, hysteretic behavior impacts current-voltage (I-V) characteristics and thus makes it difficult to determine output efficiency of a solar cell.

Advantageously, it has been found herein that incorporating a fullerene-based semiconductor layer in contact with the Se layer in an Se-based solar cell can reduce I-V hysteresis, as well as improve power-conversion-efficiency voltage and open-circuit voltage in these devices. The term "Se-based solar cell" as used herein refers to a solar cell in which Se is employed in the absorber layer. As will be described in detail below, a soluble fullerene or its derivative material can be deposited onto a conductive substrate directly, or inserted between the Se absorber layer and an auxiliary n-type semiconducting layer.

Figure 1:
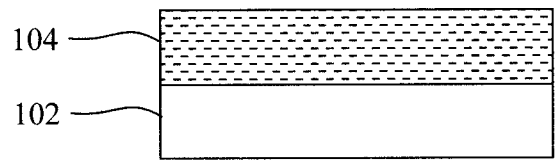
FIG. 1 is a cross-sectional diagram illustrating a first (front) contact having been formed on a substrate according to an embodiment of the present invention.
Figure 2:
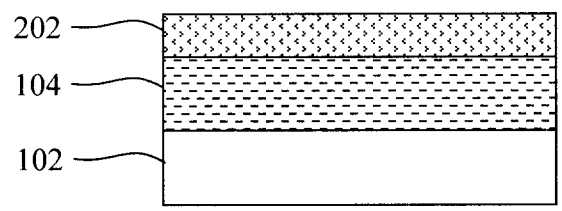
FIG. 2 is a cross-sectional diagram illustrating an optional auxiliary n-type semiconducting layer having been formed on the first (front) contact according to an embodiment of the present invention.
Figure 3:
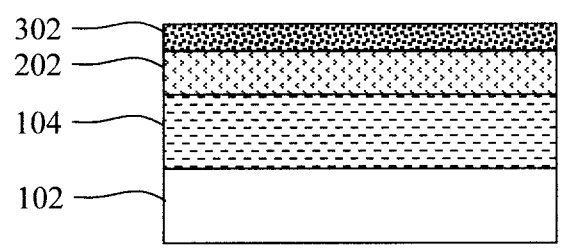
FIG. 3 is a cross-sectional diagram illustrating a fullerene (or fullerene derivative) n-type semiconducting layer having been deposited onto the auxiliary n-type semiconducting conductive layer according to an embodiment of the present invention.
Figure 4:
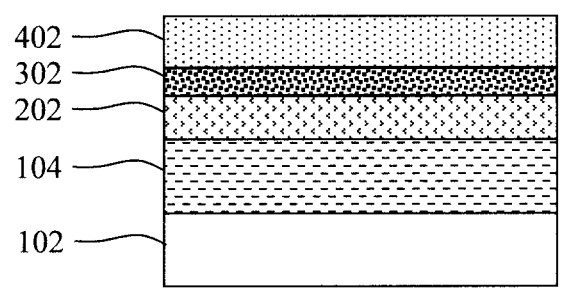
FIG. 4 is a cross-sectional diagram illustrating a (p-type) absorber layer having been formed on the fullerene n-type semiconducting layer according to an embodiment of the present invention.
Figure 5:
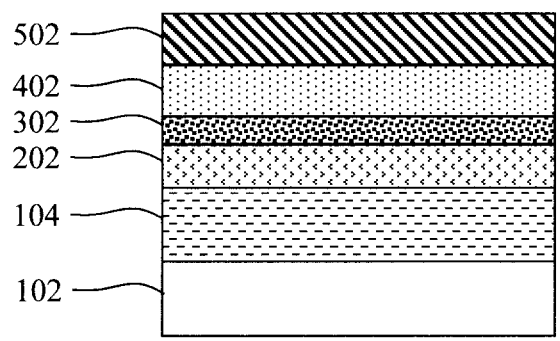
FIG. 5 is a cross-sectional diagram illustrating an optional high workfunction material having been deposited onto the absorber layer according to an embodiment of the present invention.
Figure 6:
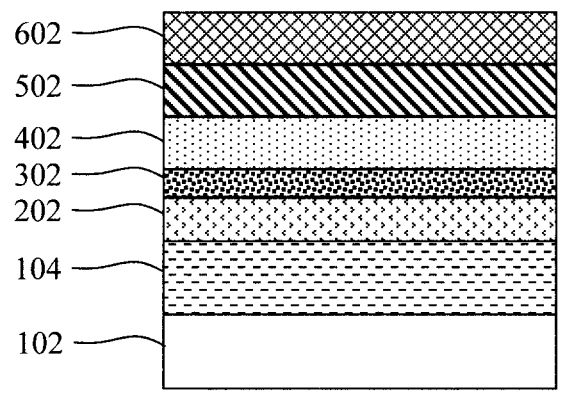
FIG. 6 is a cross-sectional diagram illustrating a back contact having been formed on the high workfunction material according to an embodiment of the present invention.

A first exemplary embodiment for forming a solar cell is now described by way of reference to FIGS. 1-8. As shown in FIG. 1, the process begins with a substrate 102. A first (front) contact 104 is formed on the substrate 102. See FIG. 1.

A couple of different configurations will be presented herein. One is a superstrate configuration, and the other a substrate configuration. The main difference between a superstrate and a substrate configuration is through which end light primarily enters the device. In a superstrate configuration, light primarily enters the solar cell at the same end as the substrate (i.e., light enters the solar cell through the substrate). By contrast, with a substrate configuration light primarily enters the solar cell at an opposite end of the device from the substrate. The process flows for fabricating these various superstrate and substrate device configurations vary primarily in the order in which the steps are performed, e.g., whether the p-type absorber layer is formed before or after the n-type semiconducting layer(s). Also, the contacts formed on the opposite ends of the solar cell are termed 'front' and 'back' contacts depending on what configuration is employed. Thus, the 'front' contact in a superstrate configuration might be in the position of a 'back' contact in a substrate design, and vice versa.

The present example deals with a superstrate configuration. Thus, the contact 104 in this case is a front contact since it is the first contact encountered along the primary light path into the device (which is through the substrate 102). The terms "first," "second," etc. may also be used herein to distinguish the contacts, and various other structures in the present solar cells. For example, the front contact 104 may also be referred to herein as a first contact, whereas the back contact (to be formed below) is referred to as a second contact.

According to an exemplary embodiment, the substrate 102 is formed from a material, such as glass (e.g., soda lime glass or SLG) or plastic, and preferably is semi-transparent. According to an exemplary embodiment, the front contact 104 is formed from a material having a bandgap of greater than about 2.5, for example, transparent conducting oxides (TCOs) such as indium-tin-oxide (ITO), fluorine-doped tin oxide $SnO_2$:F (or FTO), and/or aluminum-doped zinc oxide (AZO). The front contact 104 can be deposited onto the substrate 102 using sputtering, evaporation, or solution processing (e.g., casting).

Optionally, an auxiliary n-type semiconducting layer 202 is next deposited onto the front contact 104. See FIG. 2. The use of a fullerene or fullerene derivative n-type semiconductor (see below) can be implemented with or without an auxiliary n-type semiconducting layer 202. The auxiliary n-type semiconducting layer can serve to improve the band alignment as well as the device reliability against shunting. However, functional devices can be fabricated with fullerene or fullerene derivative as the only n-type layer. Thus, embodiments are described herein where the auxiliary n-type semiconducting layer 202 is not present, and the fullerene (or derivative thereof) is deposited directly onto the front contact 104. See, for example, FIG. 8—described below.

When present, the auxiliary n-type semiconducting layer 202 can be formed from an n-type material such as cadmium oxide (CdO), cadmium sulfide (CdS), a cadmium-zinc-sulfur material of the formula $Cd_{1-x}Zn_xS$ (wherein $0<x\le1$), indium sulfide ($In_2S_3$), zinc oxide, zinc oxysulfide (e.g., a Zn(O,S) or Zn(O,S,OH) material), aluminum oxide ($Al_2O_3$), titanium oxide ($TiO_2$), and/or a zinc magnesium oxide (ZMO) material with the formula $Zn_{1-x}Mg_xO$, wherein $0\le x\le 0.4$. The n-type material can be deposited onto the front contact 104 by sputtering, evaporation, or solution processing (e.g., casting), to form auxiliary n-type semiconducting layer 202.

As highlighted above, the present solar cells employ a Se-fullerene heterojunction, the first component of which is an n-type semiconducting layer 302 including a fullerene or fullerene derivative such as C60 (i.e., Buckminsterfullerene), phenyl-C61-butyric acid methyl ester (PCBM), indene-$C_{60}$ bisadduct (ICBA), C70, and/or [6,6]-Phenyl C71 butyric acid methyl ester (PCBM(C70)). See FIG. 3 which illustrates (fullerene) n-type semiconducting layer 302 having been deposited onto the auxiliary n-type semiconducting layer 202. As highlighted above, the use of auxiliary n-type semiconducting layer 202 is optional and embodiments are contemplated herein where fullerene n-type semiconducting layer 302 is deposited directly onto the front contact 104 (without an intervening auxiliary n-type semiconducting layer 202). See, for example, FIG. 8—described below.

The fullerene n-type semiconducting layer 302 can be formed using a solution or vacuum-based deposition method. For instance, solvents such as toluene can be used to prepare a solution of the fullerene or fullerene derivative which can then be cast onto the auxiliary n-type semiconducting layer 202 (or directly onto the front contact 104) to form the fullerene n-type semiconducting layer 302. Suitable casting processes include, but are not limited to, spin coating, spraying, ink jet printing, doctor blading, etc. A suitable vacuum method such as physical vapor deposition (PVD) of fullerenes is described, for example, in Yan et al., "Preparation of Fullerene Polycrystalline Films on Different Substrates by Physical Vapor Deposition," Materials Transactions, vol. 48, no. 4, pgs. 700-703 (March 2007), the contents of which are incorporated by reference as if fully set forth herein.

A (p-type) chalcogen absorber layer 402 (e.g., selenium (Se), sulfur (S), and/or tellurium (Te)) is next formed on the fullerene n-type semiconducting layer 302. See FIG. 4. According to an exemplary embodiment, the chalcogen absorber layer 402 contains Se such that a Se-fullerene (p-n) heterojunction is formed between n-type semiconducting layer 302 and absorber layer 402. By way of example only, in one particular configuration contemplated herein the chalcogen absorber layer 402 is pure Se (i.e., the chalcogen absorber layer 402 is from about 90% to about 99.999%, and ranges therebetween, Se). The chalcogen absorber layer 402 can be deposited onto the fullerene n-type semiconducting layer 302 by evaporation or solution processing (e.g., casting).

Following deposition of the chalcogen absorber layer 402, an anneal can be performed to crystallize the layer. By way of example only, for an Se chalcogen absorber layer 402 this crystallization anneal can be performed at a temperature of greater than or equal to about 50° C., e.g., from about 50° C. to about 210° C., and ranges therebetween) for a duration of from about 30 seconds to about 5 minutes, and ranges therebetween.

A high workfunction material 502 is next deposited onto the chalcogen absorber layer 402. See FIG. 5. By way of example only, 'high workfunction' refers herein to a material having a workfunction of greater than about 5.2 electron volts (eV). For example, high workfunction material 502 may be molybdenum trioxide ($MoO_3$) which has a workfunction of about 5.3 eV. The high workfunction material 502 advantageously serves to increase the workfunction of the back contact (to be formed below).

A back contact 602 is next formed on the high workfunction material 502. See FIG. 6. According to an exemplary embodiment, the back contact 602 is formed from a metal such as gold (Au), platinum (Pt), and/or silver (Ag). The back contact 602 can be deposited onto the high workfunction material 502 using electrochemical plating, sputtering, or evaporation.

Figure 7:
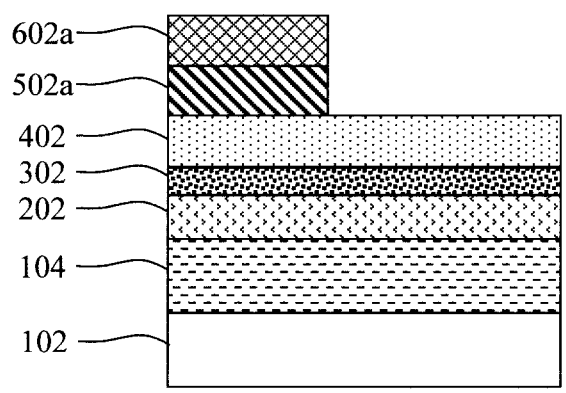
FIG. 7 is a cross-sectional diagram illustrating the high workfunction material and the back contact having been patterned according to an embodiment of the present invention.
Figure 7:

As shown in FIG. 7, the high workfunction material 502 and the back contact 602 can next be patterned, if so desired. Namely, a continuous layer of metal as the contact 602 can block light from entering the solar cell. This is an important consideration especially in the case of a substrate configuration (see below) where light primarily enters the solar cell from an end opposite the substrate. Further, in some applications, it may be desirable to have a semi-transparent solar cell, such as for wearable devices like sunglass lenses, or architectural glass, etc. See, for example, U.S. patent application Ser. No. 15/431,867, by Bishop et al., entitled "Ultra-violet-Blocking Photovoltaic Sunglasses," and U.S. patent application Ser. No. 15/431,878, by Bishop et al., entitled "Semitransparent Chalcogen Solar Cell," the contents of both of which are incorporated by reference as if fully set forth herein. As such, it might not be desirable to have an opaque (e.g., metal) contact layer covering the entire footprint of the solar cell.

Standard lithography and etching techniques can be employed to pattern the high workfunction material 502 and the back contact 602. For instance, a hardmask (not shown) can be formed on the back contact 602 masking the desired footprint and location of the patterned high workfunction material 502 and the back contact 602. Post-patterning, the high workfunction material 502 and the back contact 602 are given reference numerals 502a and 602a, respectively.

As shown in FIG. 7, the primary direction at which light enters the solar cell device is at the same end as the substrate 102, i.e., light enters the solar cell device through the substrate. This is the superstrate configuration referenced above.

Figure 8:
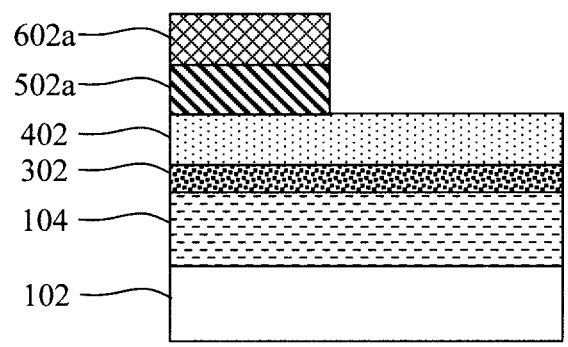
FIG. 8 is a cross-sectional diagram illustrating an alternative embodiment wherein the fullerene n-type semiconducting layer is disposed directly onto the front contact according to an embodiment of the present invention.

As described above, the use of an auxiliary n-type semiconducting layer 202 is optional. See, for example, FIG. 8. As shown in FIG. 8, there is no intervening layer between the fullerene n-type semiconducting layer 302 and the front contact 104. Thus, configurations are anticipated herein where the fullerene n-type semiconducting layer 302 is deposited directly onto the front contact 104.

Figure 9:
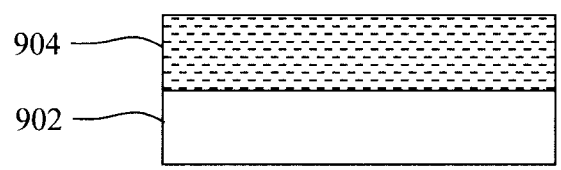
FIG. 9 is a cross-sectional diagram illustrating, according to an alternative embodiment, a first (back) contact having been formed on a substrate according to an embodiment of the present invention.
Figure 10:
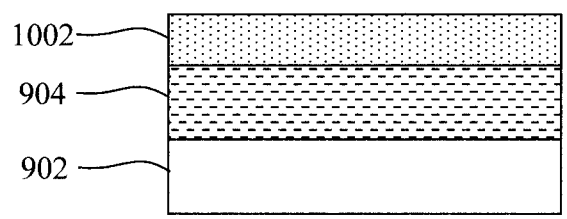
FIG. 10 is a cross-sectional diagram illustrating a (p-type) absorber layer having been formed on the back contact according to an embodiment of the present invention.
Figure 11:
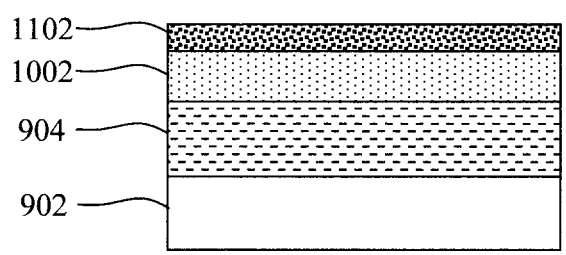
FIG. 11 is a cross-sectional diagram illustrating a fullerene (or fullerene derivative) n-type semiconducting layer having been formed on the absorber layer according to an embodiment of the present invention.
Figure 12:
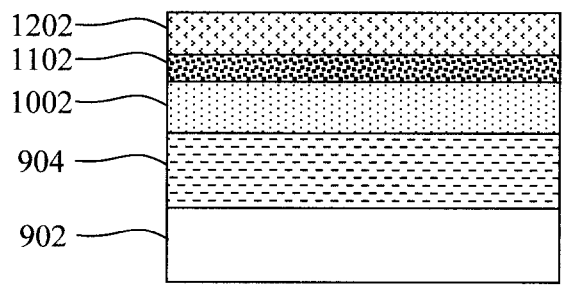
FIG. 12 is a cross-sectional diagram illustrating an optional auxiliary n-type semiconducting layer having been deposited onto the fullerene n-type semiconducting layer according to an embodiment of the present invention.
Figure 13:
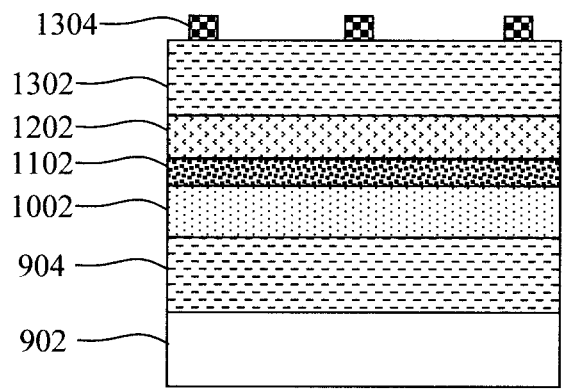
FIG. 13 is a cross-sectional diagram illustrating a second (front) contact having been formed on the auxiliary n-type semiconducting layer, and a metal grid having been formed on the front contact according to an embodiment of the present invention.

Another exemplary embodiment for forming a solar cell is now described by way of reference to FIGS. 9-17. In this exemplary embodiment, a substrate process flow is implemented. As provided above, with a substrate configuration light primarily enters the solar cell at an opposite end of the device from the substrate. A substrate process flow involves the fabrication steps being performed in essentially the reverse order to that of the superstrate process flow described above. For instance, as shown in FIG. 9 the process begins with a substrate 902, and a first contact 904 being formed on the substrate 902 using, e.g., sputtering, evaporation, or solution processing (e.g., casting). However, in this case contact 904 is a back contact since it is at the back of the device (along the path of light through the solar cell).

As above, suitable materials for substrate 902 include, but are not limited to, glass (e.g., soda lime glass or SLG) or plastic. Preferably substrate 902 is semi-transparent. Suitable materials for the back contact 904 include, but are not limited to, materials having a bandgap of greater than about 2.5, for example, TCOs such as ITO, FTO, and/or AZO.

A (p-type) chalcogen absorber layer 1002 (e.g., Se, S, and/or Te) is next formed on the back contact 904. See FIG. 10. According to an exemplary embodiment, the chalcogen absorber layer 1002 contains Se. By way of example only, in one particular configuration contemplated herein the chalcogen absorber layer 1002 is pure Se (i.e., the chalcogen absorber layer 1002 is from about 90% to about 99.999%, and ranges therebetween, Se). The chalcogen absorber layer 1002 can be deposited onto the back contact 904 by evaporation or solution processing (e.g., casting).

Following deposition of the chalcogen absorber layer 1002, an anneal can be performed to crystallize the layer. By way of example only, for an Se chalcogen absorber layer 1002 this crystallization anneal can be performed at a temperature of greater than or equal to about 50° C., e.g., from about 50° C. to about 210° C., and ranges therebetween) for a duration of from about 30 seconds to about 5 minutes, and ranges therebetween.

An n-type semiconducting layer 1102 including a fullerene or fullerene derivative such as C60, PCBM, ICBA, C70, and/or PCBM(C70) is next formed on the chalcogen absorber layer 1002. See FIG. 11. When the chalcogen absorber layer 1002 contains Se, a Se-fullerene (p-n) heterojunction is formed between fullerene n-type semiconducting layer 1102 and chalcogen absorber layer 1002. Solution and vacuum-based techniques for forming fullerene n-type semiconducting layer 1102 were provided above.

Optionally, an auxiliary n-type semiconducting layer 1202 can be deposited onto the fullerene n-type semiconducting layer 1102. See FIG. 12. However, as noted above, the use of fullerene n-type semiconducting layer 1102 can be implemented with or without this auxiliary n-type semiconducting layer 1202. Thus, embodiments are described herein where the auxiliary n-type semiconducting layer 1202 is not present. See, for example, FIG. 17—described below.

When present, the auxiliary n-type semiconducting layer 1202 can be formed from an n-type material such as CdO, CdS, a cadmium-zinc-sulfur material of the formula $Cd_{1-x}Zn_xS$ (wherein $0<x\leq 1$), $In_2S_3$, zinc oxide, zinc oxysulfide (e.g., a Zn(O,S) or Zn(O,S,OH) material), $Al_2O_3$, titanium $TiO_2$, and/or a ZMO material with the formula $Zn_{1-x}Mg_xO$, wherein $0\leq x\leq 0.4$. The n-type material can be deposited onto the fullerene n-type semiconducting layer 1102 by sputtering, evaporation, or solution processing (e.g., casting), to form auxiliary n-type semiconducting layer 1202.

A second (front) contact 1302 is then formed on the auxiliary n-type semiconducting layer 1202, if present, or directly on the fullerene n-type semiconducting layer 1102 (see FIG. 17—described below) using, e.g., sputtering, evaporation, or solution processing (e.g., casting). As above, suitable materials for the front contact 1302 include, but are not limited to, materials having a bandgap of greater than about 2.5, for example, TCOs such as ITO, FTO, and/or AZO. A metal grid 1304 may be formed on the front contact 1302. Suitable metal grid materials include, but are not limited to nickel (Ni) and/or aluminum (Al).

As provided above, use of a high workfunction material at the back contact can be advantageous. Thus optionally a high workfunction material can now be placed at the back contact. While this can be accomplished in more than one way, the notion here is that a completed solar cell is first fabricated on the substrate 904, and then exfoliated from the substrate 902/back contact 904 to expose a back surface of the device. A high workfunction material and metal back contact can then be added to the exposed back surface. This process is detailed in U.S. patent application Ser. No. 15/425,717, by Antunez et al., entitled "High Work Function $MoO_2$ Back Contacts for Improved Solar Cell Performance," the contents of which are incorporated by reference as if fully set forth herein.

Figure 14:
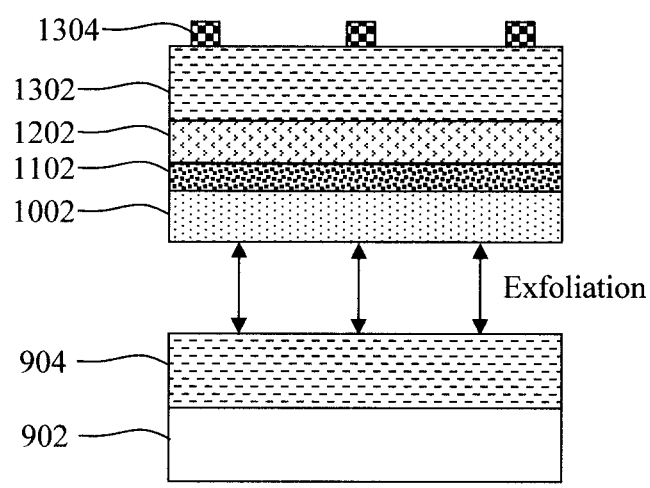
FIG. 14 is a cross-sectional diagram illustrating the completed device being optionally exfoliated from the substrate/back contact, exposing a back side of the device according to an embodiment of the present invention.
Figure 15:
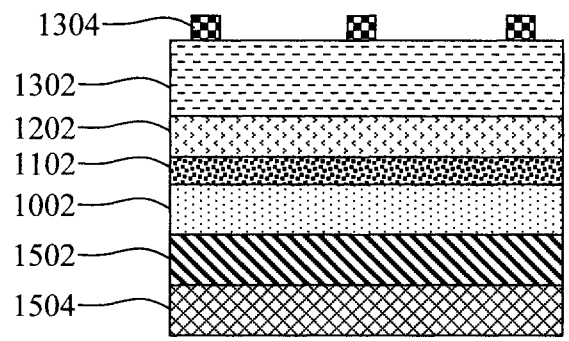
FIG. 15 is a cross-sectional diagram illustrating a high workfunction material having been deposited on the back side of the device, followed by a back contact according to an embodiment of the present invention.

Thus, as shown in FIG. 14, the completed device is optionally exfoliated from the substrate 902/back contact 904. Mechanical, chemical, thermal, etc. exfoliation techniques may be employed. For instance, a hammer and chisel can be employed whereby the blade of the chisel is placed at the juncture of the back contact 904 and the chalcogen absorber layer 1002, and the chisel struck with the hammer causing a separation of the layers. Chemical exfoliation is described, for example, in Pachauri et al., "Chemically exfoliated large-area two-dimensional flakes of molybdenum disulfide for device applications," APL MATERIALS 1, 032102 (September 2013) (10 pages), the contents of which are incorporated by reference as if fully set forth herein. Thermal exfoliation is described, for example, in U.S. Patent Application Publication Number 2016/0204304 by Gunawan et al., entitled "Substrate-Free Thin-Film Flexible Photovoltaic Device and Fabrication Method," the contents of which are incorporated by reference as if fully set forth herein.

Following exfoliation, the back surface of the device is exposed. It is on that back surface that a high workfunction material 1502 can be deposited, followed by a back contact 1504. See FIG. 15. As described above, by 'high workfunction' it is meant that the material has a workfunction of greater than about 5.2 eV. For example, high workfunction material 1502 may be $MoO_3$ which has a workfunction of about 5.3 eV. The high workfunction material 1502 advantageously serves to increase the workfunction of the back contact 1504. According to an exemplary embodiment, the back contact 1504 is formed from a metal such as Au, Pt, and/or Ag. The back contact 1504 can be deposited onto the high workfunction material 1502 using electrochemical plating, sputtering, or evaporation.

It is not necessary for the high workfunction material 1502/back contact 1504 to cover the entire back surface of the device and, as described above, standard lithography and etching techniques can be employed to pattern the high workfunction material 1502 and the back contact 1504. See FIG. 16. Post-patterning, the high workfunction material 1502 and the back contact 1504 are given reference numerals 1502a and 1504a, respectively.

Figure 16:
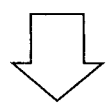
FIG. 16 is a cross-sectional diagram illustrating the high workfunction material and the back contact having been patterned according to an embodiment of the present invention.
Figure 16:
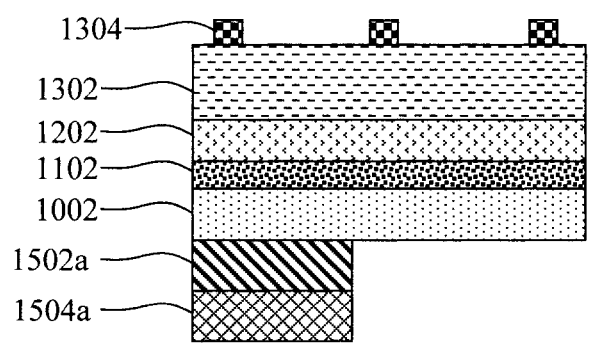

As shown in FIG. 16, the primary direction at which light enters the solar cell device is at an end opposite the substrate 902 (or an end from which the substrate 902 was removed). This is the substrate configuration referenced above.

Figure 17:
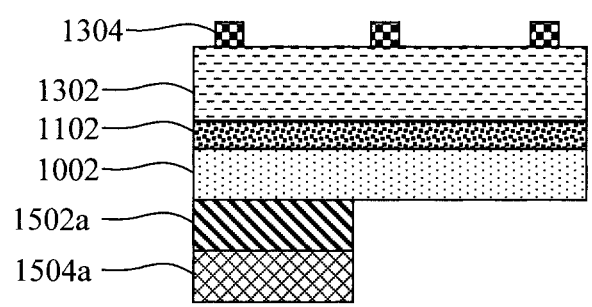
FIG. 17 is a cross-sectional diagram illustrating an alternative embodiment wherein an auxiliary n-type semiconducting layer is not present according to an embodiment of the present invention.

As described above, the use of auxiliary n-type semiconducting layer 1202 is optional. See, for example, FIG. 17. As shown in FIG. 17, there is no auxiliary n-type semiconducting layer 1202 on the fullerene n-type semiconducting layer 1102.

Figure 18:
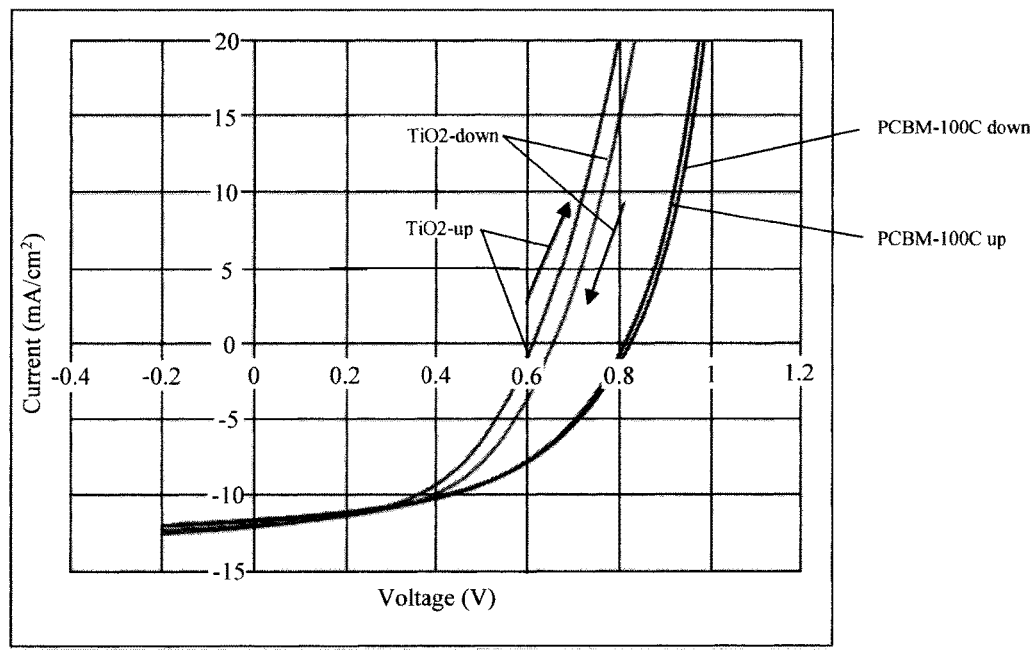
FIG. 18 is a diagram illustrating current-voltage (I-V) characteristics of a solar cell prepared according to the present techniques with a fullerene n-type semiconducting layer of PCBM on an auxiliary n-type semiconducting layer of titanium oxide ($TiO_2$) according to an embodiment of the present invention.

FIG. 18 is a diagram illustrating how the use of a fullerene (PCBM) on an auxiliary n-type semiconducting layer such as $TiO_2$ almost completely eliminates hysteretic behavior. In the current-voltage (I-V) curves shown in FIG. 18, hysteresis was evaluated based on scans performed in the up (progressively increasing open circuit voltage (Voc) values) and down (decreasing Voc values) direction.

Figure 19:
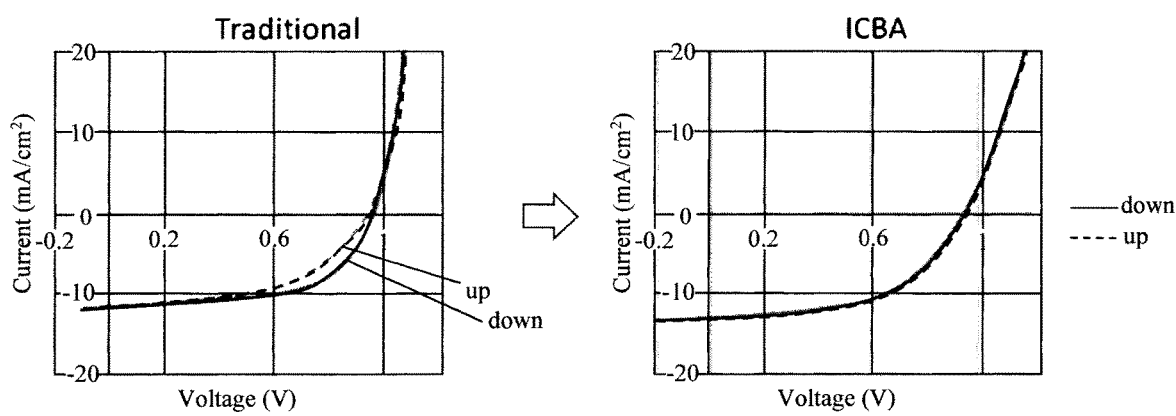
FIG. 19 is a diagram illustrating I-V characteristics of a solar cell prepared according to the present techniques with a fullerene n-type semiconducting layer of ICBA on an auxiliary n-type semiconducting layer of ZMO according to an embodiment of the present invention.

FIG. 19 is a diagram illustrating how the use of a fullerene (ICBA) on an auxiliary n-type semiconducting layer of ZMO almost completely eliminates hysteretic behavior, as compared to a traditional solar cell (i.e., without fullerene). FIG. 20 is a diagram illustrating the characteristics of the ICBA/ZMO solar cell of FIG. 19. The electrical characteristics shown are efficiency (Eff), fill factor (FF), open circuit voltage (Voc), open circuit current (Jsc), series resistance ($R_S$) which is approximated by R at Jsc, and shunt resistance ($R_{Sh}$) which is approximated by R at Voc).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A solar cell, comprising:
   a back contact;
   a high workfunction material disposed on the back contact, wherein the high workfunction material has a workfunction of greater than about 5.2 eV;
   a p-type chalcogen absorber layer disposed on the high workfunction material;
   an n-type semiconducting layer disposed on the p-type chalcogen absorber layer, wherein the n-type semiconducting layer comprises a fullerene or fullerene derivative selected from the group consisting of: C60, phenyl-C61-butyric acid methyl ester, indene-$C_{60}$ bisadduct, C70, [6,6]-Phenyl C71 butyric acid methyl ester, and combinations thereof;
   a front contact disposed on the n-type semiconducting layer; and
   a metal grid disposed on the front contact,
   wherein the high workfunction material and the back contact are located off to one side of the solar cell and cover only a portion of the p-type chalcogen absorber layer along a bottom surface of the p-type chalcogen absorber layer, while another portion of the p-type chalcogen absorber layer is uncovered by the high workfunction material and the back contact.

2. The solar cell of claim 1, wherein the back contact and the front contact each comprises a transparent conducting oxide selected from the group consisting of: indium-tin-oxide, fluorine-doped tin oxide, aluminum-doped zinc oxide, and combinations thereof.

3. The solar cell of claim 1, wherein the p-type chalcogen absorber layer comprises selenium such that a selenium-fullerene heterojunction is present between the p-type chalcogen absorber layer and the n-type semiconducting layer.

4. The solar cell of claim 3, wherein the p-type chalcogen absorber layer comprises pure selenium.

5. The solar cell of claim 1, further comprising:
   an auxiliary n-type semiconducting layer disposed on the n-type semiconducting layer, wherein the auxiliary n-type semiconducting layer comprises a different material from the n-type semiconducting layer.

6. The solar cell of claim 5, wherein the auxiliary n-type semiconducting layer comprises a material selected from the group consisting of: cadmium oxide, cadmium sulfide, a cadmium-zinc-sulfur material, indium sulfide, zinc oxide, zinc oxysulfide, aluminum oxide, titanium oxide, zinc magnesium oxide, and combinations thereof.

7. The solar cell of claim 1, wherein the metal grid comprises a material selected from the group consisting of: nickel, aluminum, and combinations thereof.

8. The solar cell of claim 1, wherein the solar cell is a semi-transparent solar cell, and wherein the high workfunction material and the back contact cover less than an entire footprint of the semi-transparent solar cell.

9. The solar cell of claim 1, wherein the n-type semiconducting layer is disposed directly on the p-type chalcogen absorber layer.

* * * * *